(12) United States Patent
Zhang et al.

(10) Patent No.: US 11,856,748 B2
(45) Date of Patent: Dec. 26, 2023

(54) SEMICONDUCTOR MEMORY PREPARATION METHOD AND SEMICONDUCTOR MEMORY

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 233 days.

(21) Appl. No.: 17/599,792

(22) PCT Filed: Jun. 1, 2021

(86) PCT No.: PCT/CN2021/097767
§ 371 (c)(1),
(2) Date: Sep. 29, 2021

(87) PCT Pub. No.: WO2022/037181
PCT Pub. Date: Feb. 24, 2022

(65) Prior Publication Data
US 2023/0103594 A1     Apr. 6, 2023

(30) Foreign Application Priority Data
Aug. 21, 2020   (CN) .......................... 202010849913.6

(51) Int. Cl.
*H10B 12/00*     (2023.01)
(52) U.S. Cl.
CPC .......... *H10B 12/033* (2023.02); *H10B 12/31* (2023.02); *H10B 12/482* (2023.02); *H10B 12/485* (2023.02)

(58) Field of Classification Search
CPC .... H10B 12/033; H10B 12/31; H10B 12/482; H10B 12/485; H10B 12/315; H10B 12/0335
See application file for complete search history.

(56) References Cited

U.S. PATENT DOCUMENTS 10,151,048 B1 * 12/2018 Wu ........................ H10B 12/09
2013/0214420 A1 * 8/2013 Shimamoto ........ H10B 12/0335
                                                               257/773
(Continued)

FOREIGN PATENT DOCUMENTS

| CN | 101271867 A | 9/2008 |
| CN | 109244118 A | 1/2019 |
| CN | 111192876 A | 5/2020 |

OTHER PUBLICATIONS

International Search Report cited in PCT/CN2021/097767 dated Sep. 2, 2021, 9 pages.

*Primary Examiner* — Mohammed R Alam
(74) *Attorney, Agent, or Firm* — Cooper Legal Group, LLC

(57) ABSTRACT

The present disclosure discloses a semiconductor memory preparation method and a semiconductor memory, relating to the technical field of semiconductors. The method includes: providing a semiconductor substrate in which transistors are formed and have an array layout; forming a film stack structure on the semiconductor substrate; forming through holes penetrating the film stack structure to expose sources of the transistors; epitaxially growing a storage node contact layer on exposed surfaces of the sources of the transistors; and forming a bottom electrode of a capacitor on a surface of the storage node contact layer.

15 Claims, 16 Drawing Sheets

(56) References Cited

U.S. PATENT DOCUMENTS

2015/0357335 A1* 12/2015 Kunishima .......... H10B 12/033
  257/296
2018/0350611 A1* 12/2018 Kim .................. H01L 21/76805
2021/0217658 A1* 7/2021 Kim .................. H01L 21/76843

* cited by examiner

SEMICONDUCTOR MEMORY PREPARATION METHOD AND SEMICONDUCTOR MEMORY

CROSS-REFERENCE TO RELATED APPLICATIONS

The present disclosure is a national stage entry of International Application No. PCT/CN2021/097767, filed on Jun. 1, 2021, which claims the priority to Chinese Patent Application 202010849913.6, titled "SEMICONDUCTOR MEMORY PREPARATION METHOD AND SEMICONDUCTOR MEMORY", filed on Aug. 21, 2020. The entire contents of International Application No. PCT/CN2021/097767 and Chinese Patent Application 202010849913.6 are incorporated herein by reference.

TECHNICAL FIELD

The present disclosure relates to the technical field of semiconductors, and in particular, to a semiconductor memory preparation method and a semiconductor memory.

BACKGROUND

A storage cell (hereinafter referred to as cell) in a semiconductor memory, for example DRAM (Dynamic Random Access Memory), uses a storage capacitor (hereinafter referred to as capacitor) to store bit information. From a theoretical perspective, a simplest DRAM storage cell that stores a bit of information comprises the following four parts: a storage capacitor, which represents logic 1 and 0 by the quantity of charges stored in the storage capacitor or the difference in voltages at two ends of the capacitor; a transistor, the turn-on and turn-off of which determine whether to allow or prohibit the reading and rewriting of the information stored in the storage capacitor; a wordline, which determines the turn-on and turn-off of the transistor; and a bitline (hereinafter referred to as BL), which is the only way for the outside world to access the storage capacitor, wherein, when the transistor is turned on, the outside world can read from or write to the storage capacitor through the bitline.

In the related technologies, the DRAM preparation process requires the preparation of BLs, storage nodes, storage node pads, cells, etc. Especially in the advanced processes, multiple etchings by a photomask are required to prepare the BLs, storage nodes, and storage node pads; then, film stacks of cells are prepared; and then cells are prepared by the photomask etching, with the bottoms of the cells being aligned with and connected to the storage node pads. In this way, it is necessary to align the bottoms of the cells with the storage node pads, align the storage node pads with the storage nodes, and align the storage nodes with the active areas. It is complicated and difficult to control.

It is to be noted that the information disclosed in the background section is only provided to facilitate the understanding of the background of the present disclosure, and therefore may include information that does not constitute the existing technologies known to a person of ordinary skill in the art.

SUMMARY

An embodiment of the present disclosure provides a semiconductor memory preparation method, comprising: providing a semiconductor substrate in the semiconductor substrate transistors are formed and have an array layout; forming a film stack structure on the semiconductor substrate; forming through holes penetrating the film stack structure to expose sources of the transistors; epitaxially growing a storage node contact layer on exposed surfaces of the sources of the transistors; and forming a bottom electrode of a capacitor on a surface of the storage node contact layer.

An embodiment of the present disclosure provides a semiconductor memory, comprising: a semiconductor substrate, in the semiconductor substrate transistors are formed and have an array layout; a film stack structure, located on the semiconductor substrate; a storage node contact layer, located in the film stack structure and in contact with sources of transistors; and a bottom electrode of a capacitor, located on a surface of the storage node contact layer.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort.

DETAILED DESCRIPTION

Figure 1:
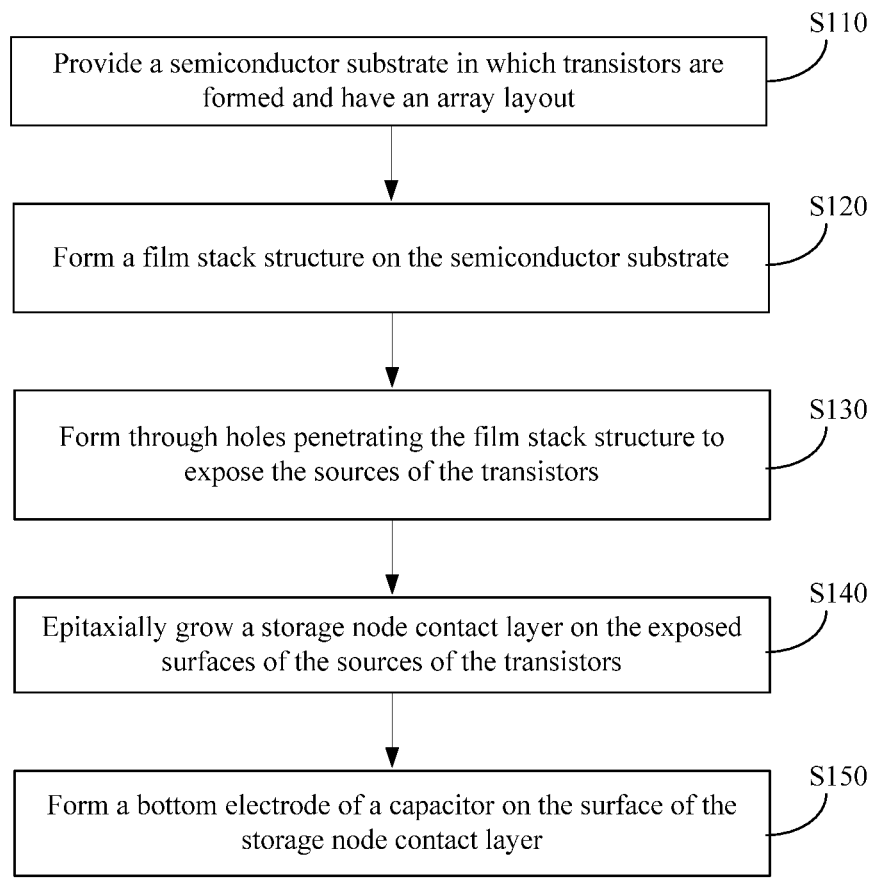
FIG. 1 schematically shows a flowchart of a semiconductor memory preparation method according to an embodiment of the present disclosure.

Exemplary implementations will now be described more fully with reference to the accompanying drawings. However, the exemplary implementations may be implemented in various forms, and should not be construed as being limited to the implementations set forth herein; instead, these implementations are provided to make the present disclosure more comprehensive and complete, and to fully convey the concepts of the exemplary implementations to those skilled in the art. The same reference numerals in the figures denote the same or similar structures, and thus the repeated description thereof will be omitted. In addition, the drawings are merely schematic illustrations of the present disclosure, and are not necessarily drawn to scale.

Although relative terms such as "upper" and "lower" are used in this specification to describe the relative relationship between one component and another component, these terms are used in this specification just for convenience, for example, in the direction as shown in the drawings. It can be understood that, if the device as shown is turned upside down, the component described as "upper" will become the "lower" component. When a structure is arranged "on" other structures, it may mean that the structure is integrally formed on the other structures, or that the structure is "directly" arranged on the other structures, or that the structure is "indirectly" arranged on the other structures through another structure.

The terms "a", "an", "this", "the" and "at least one" are used to indicate the presence of one or more elements/components/etc.; the terms "comprising" and "having" are used to indicate non-exclusive inclusion and indicate the presence of other elements/components/etc. in addition to the listed elements/components/etc.; and the terms "first" and "second" are used only as marks, rather than limiting the number of objects.

FIG. 1 schematically shows a flowchart of a semiconductor memory preparation method according to an embodiment of the present disclosure. As shown in FIG. 1, the method according to an embodiment of the present disclosure may comprise the following steps.

In step S110, a semiconductor substrate is provided, in which transistors are formed and have an array layout.

In the embodiment of the present disclosure, providing a semiconductor substrate may be used to provide an operating platform for subsequent processes. The semiconductor substrate may be made of any base material used to bear elements of a semiconductor integrated circuit. It may be a die, or a wafer processed by an epitaxial growth process. The semiconductor substrate may be, for example, any one or more of a silicon-on-insulator (SOI) substrate, a bulk silicon substrate, a germanium substrate, a silicon germanium substrate, an indium phosphide (InP) substrate, a gallium arsenide (GaAs) substrate, a germanium-on-insulator substrate, etc.

In the embodiment of the present disclosure, transistors arranged in an array are formed in the semiconductor substrate, for example MOSFETs (Metal-Oxide-Semiconductor Field-Effect Transistors), but the present disclosure is not limited thereto. The active area (AA area) is used to establish the position of the transistor body, on which the source, drain and gate of the transistor are formed. The two AA areas may be isolated by STI, for example. However, the isolation process between the AA areas is not limited in the present disclosure. In the following embodiments, STI is used as an example for illustration.

In the sub-micron technology, shallow trench isolation (STI) structures have replaced other semiconductor memory isolation methods, for example the local oxidation of silicon (LOCOS) technology which requires a larger valuable area.

In the shallow trench isolation process, shallow trenches are formed in the semiconductor substrate between the semiconductor active areas, and the MOSFETs are electrically isolated from each other. The shallow trench is filled with insulating material, for example silicon oxide, to provide electrical insulation.

In step S120, a film stack structure is formed on the semiconductor substrate.

In an exemplary embodiment, before forming a film stack structure on the semiconductor substrate, the method may further comprise: forming a bitline contact layer on the semiconductor substrate; forming bitline on the bitline contact layer; forming a bitline isolating layer on the surface of the bitline; and forming an insulating dielectric layer on the bitline isolating layer.

In step 130, through holes penetrating the film stack structure is formed to expose the sources of the transistors.

In an exemplary embodiment, the film stack structure may comprise sacrificial layers and support layers. For example, it may comprise multiple sacrificial layers and multiple support layers. One support layer is stacked on one sacrificial layer, another sacrificial layer is stacked on this support layer, and another support layer is stacked on the another sacrificial layer . . . and so on. The number of sacrificial layers and support layers, the thickness of layers, the material for the layers and the like are not limited in the present disclosure, and may be determined according to actual needs.

In an exemplary embodiment, the material for the sacrificial layer may comprise at least one of oxide, tetraethyl orthosilicate (TEOS), spin-on organic carbon, amorphous carbon, photoresist, and silicon-containing polymer.

In an exemplary embodiment, forming through holes penetrating the film stack structure to expose the sources of the transistors may comprise: depositing a hard mask layer on the surface of the film stack structure; etching, by a photomask, the hard mask layer to form the through holes, to expose the sources of the transistors; and removing the hard mask layer.

In step S140, a storage node contact layer is epitaxially grown on the exposed surfaces of the sources of the transistors.

In an exemplary embodiment, the upper surface of the storage node contact layer may be horizontally aligned with the lower surface of the film stack structure.

In an exemplary embodiment, the upper surface of the storage node contact layer may be higher than the bitline and lower than the lower surface of the film stack structure.

In the embodiment of the present disclosure, the height of the storage node contact layer is slightly higher than that of the bitline, and slightly lower than the bottommost layer of the film stack structure used to form the capacitor (for example, the storage node contact layer may be located a few nanometers to dozens of nanometers below the lower surface of the film stack structure, and it is not limited in the present disclosure). In this way, the bottom electrode of the capacitor formed subsequently may be directly connected to the storage node contact layer below the film stack structure of the capacitor. This increases the length of the capacitor and can increase the storage capacity of the capacitor.

In an exemplary embodiment, the upper surface of the storage node contact layer may be lower than the bitline.

In the embodiment of the present disclosure, the height of the storage node contact layer is slightly lower than the bitline, that is, the upper surface of the storage node contact layer is lower than the upper surface of the bitline, so that the bottom electrode of the capacitor may be more directly connected to the storage node contact layer below the film stack structure of the capacitor. The length of the capacitor is further increased, and the storage capacity of the capacitor is further increased.

In the embodiment of the present disclosure, the storage node contact layer is generated by epitaxial growth, for example, an epitaxial process of silicon or silicon germanium. In the following examples, the selective epitaxial growth (SEG) technology of silicon is used as an example, but the present disclosure is not limited thereto.

In an exemplary embodiment, epitaxially growing a storage node contact layer on the exposed surfaces of the sources of the transistors may comprise: forming a silicon epitaxial storage node contact layer by selective epitaxial growth of silicon on the exposed surfaces of the sources of the transistors; and doping the silicon epitaxial storage node contact layer in situ to form the storage node contact layer.

In the embodiment of the present disclosure, doping can reduce the resistance of the storage node contact layer, and P-type doping or N-type doping may be used. If the semiconductor memory to be prepared in the embodiment of the present disclosure uses NMOS (N-Metal-Oxide-Semiconductor), N-type doping may be used to prevent the formation of PN junctions by doping.

In an exemplary embodiment, epitaxially growing a storage node contact layer on the exposed surfaces of the sources of the transistors may comprise: forming a silicon epitaxial storage node contact layer by selective epitaxial growth of silicon on the exposed surfaces of the sources of the transistors; and performing ion implantation on the silicon epitaxial storage node contact layer to form the storage node contact layer.

For example, phosphorus ions may be implanted, but the present disclosure is not limited thereto.

In the embodiment of the present disclosure, after forming the through holes between the cell and the storage node contact layer, the storage node contact layer is prepared by the SEG process. The SEG process can form monocrystalline silicon to improve the conductivity of the contact layer. Further, doping in-situ may be performed in the SEG process or ion implantation may be performed after the SEG process to further improve the conductivity of the storage node contact layer.

In step 150, a bottom electrode of a capacitor is formed on the surface of the storage node contact layer.

In an exemplary embodiment, when the upper surface of the storage node contact layer is higher than the bitline and lower than the lower surface of the film stack structure; or, when the upper surface of the storage node contact layer is lower than the bitline, forming a bottom electrode of the capacitor on the surface of the storage node contact layer may comprise: depositing a metal layer on the upper surface of the storage node contact layer; and forming a bottom electrode of the capacitor on the surface of the metal layer.

In the embodiment of the present disclosure, by further depositing a metal layer on the upper surface of the storage node contact layer, the conductivity of the storage node contact layer may be further improved, and meanwhile, the connection with the bottom electrode of the capacitor may be improved and the stress on the contact interface may be reduced.

For example, the metal layer may be made of at least one or more of titanium nitride (TiN), molybdenum (Mo), ruthenium (Ru), tungsten (W), etc. The material for the metal layer is not limited in the present disclosure.

In an exemplary embodiment, when the upper surface of the storage node contact layer is lower than the bitline, forming a bottom electrode of a capacitor on the surface of the storage node contact layer may comprise: etching the bitline isolating layer to form air clearances between the storage node contact layer and the bitline; and forming a bottom electrode of the capacitor on the surface of the storage node contact layer, with the bottom electrode closing the air clearances to form air gaps.

For example, the bitline isolating layer may be etched by a wet etching process. However, the etching process is not limited in the present disclosure.

In the embodiment of the present disclosure, by etching the bitline isolating layer, air gaps are formed between the storage node contact layer and the bitline, which can further improve the isolation effect and reduce the parasitic capacitance.

In an exemplary embodiment, when the upper surface of the storage node contact layer is lower than the bitline, forming a bottom electrode of a capacitor on the surface of the storage node contact layer may comprise: etching the bitline isolating layer to form air clearances between the storage node contact layer and the bitline; depositing a metal layer on the upper surface of the storage node contact layer, with the metal layer closing the air clearances to form air gaps; and forming a bottom electrode of the capacitor on the surface of the metal layer.

In the embodiment of the present disclosure, on one hand, by etching the bitline isolating layer, air gaps are formed between the storage node contact layer and the bitline, which can further improve the isolation effect and reduce the parasitic capacitance; and on the other hand, by further depositing a metal layer on the upper surface of the storage node contact layer, the conductivity of the storage node contact layer may be further improved, and meanwhile, the connection with the bottom electrode of the capacitor may be improved and the stress on the contact interface may be reduced.

In an exemplary embodiment, after forming the bottom electrode of the capacitor on the surface of the storage node contact layer, the method may further comprise: removing the sacrificial layers; depositing a dielectric layer located between the support layers and on the bottom electrode; and forming a top electrode of the capacitor on the dielectric layer.

The method in the embodiment of the present disclosure can use the SEG process to directly form a storage node contact layer in through holes, and may be applied to the preparation of a semiconductor memory. The semiconductor memory may be, for example, any one of DRAMs, SDRAMs (synchronous dynamic random-access memories), DDR (double data rate) SDRAMs, etc. The type of semiconductor memories is not limited in the present disclosure.

In the semiconductor memory preparation method in some implementations of the present disclosure, the sources of the transistors in the semiconductor substrate is directly exposed by forming through holes penetrating through the film stack structure, a storage node contact layer is epitaxially grown on the exposed surfaces of the sources of the transistors, and then a bottom electrode of a capacitor is formed on the surface of the storage node contact layer. Only one alignment of the cell with the active area by a photomask is required. In this way, a lot of preparation processes can be reduced. The cost for manufacturing the semiconductor memory can be reduced, and the manufacturing efficiency can be improved.

The semiconductor memory preparation method in the above embodiment will be described below with reference to FIGS. 2-27.

Figure 2:
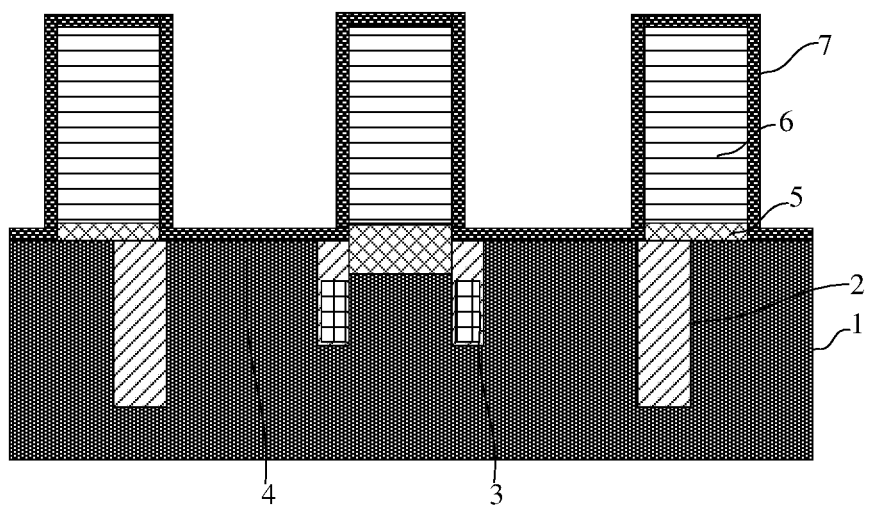
FIGS. 2-9 schematically show a flowchart of a semiconductor memory preparation method according to an embodiment of the present disclosure.

FIGS. 2-9 schematically show a flowchart of a semiconductor memory preparation method according to an embodiment of the present disclosure. In the embodiment of FIG. 2, it is assumed that the semiconductor substrate 1 is isolated by shallow trench isolation (STI). A shallow trench isolation trench is formed on the semiconductor substrate 1, and then dielectric layer is filled in the shallow trench isolation trench to form a shallow trench isolation structure 2. Multiple active areas are formed on the semiconductor substrate 1 by the shallow trench isolation structure 2, and the multiple active areas may be arranged in an array. STI can achieve high-density isolation and is suitable for high-density memories such as deep sub-micron devices and DRAMs.

As shown in FIG. 2, first, a BL structure (bitline structure) is provided. The BL structure may comprise a semiconductor substrate 1, a shallow trench isolation structure 2, gates 3 and sources 4 of transistors arranged in an array in the semiconductor substrate 1, a bitline contact layer 5, a bitline 6 and a bitline isolating layer 7.

Figure 3:
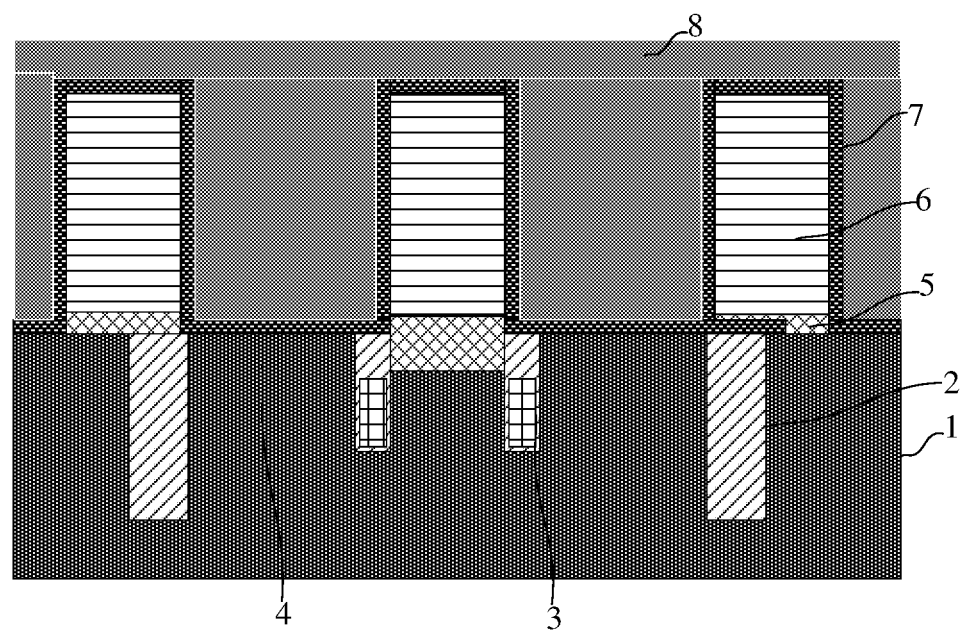

As shown in FIG. 3, an insulating dielectric material may be filled with, for example, an SOD (Spin On Dielectric) or CVD (Chemical Vapor Deposition) process, so that the insulating dielectric material is filled between the bitline structures, and processed by, for example, CMP (Chemical Mechanical Polishing) process for polishing to form the insulating dielectric layer 8.

For the CVD process, the insulating dielectric layer 8 is formed after the deposition of reaction products in the gas phase. For the SOD process, the insulating dielectric layer 8 is formed by coating with liquid substance and then sintering.

Figure 4:
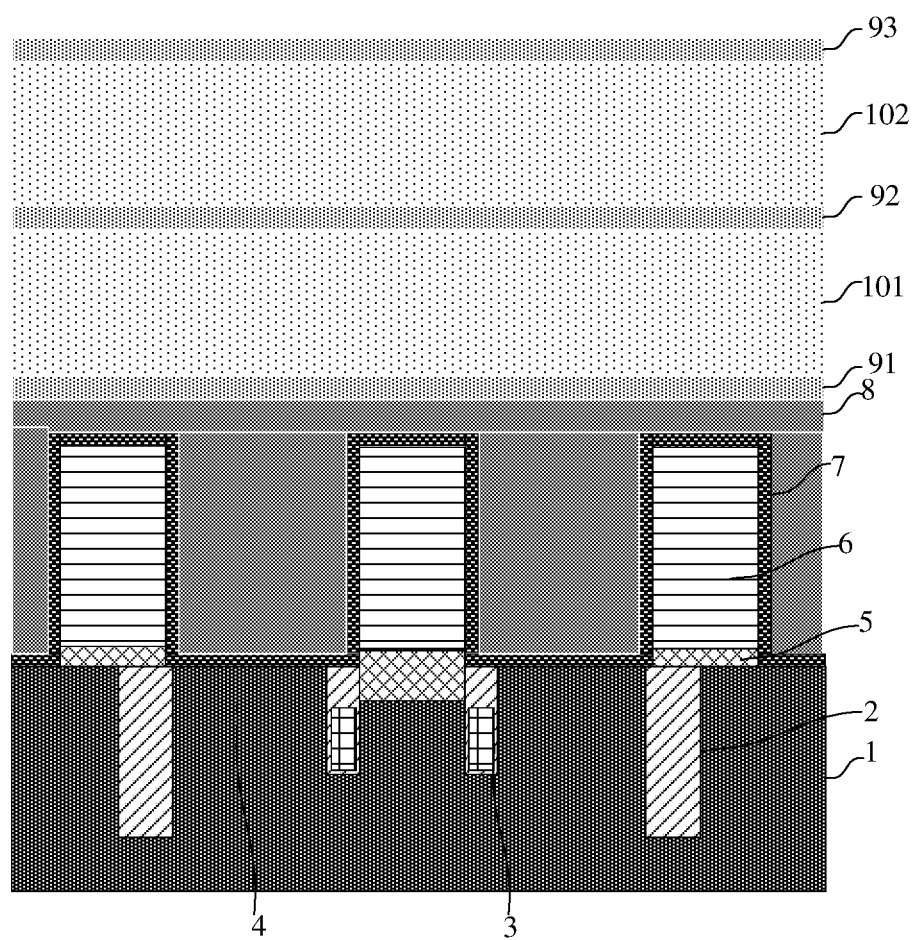

As shown in FIG. 4, a film stack structure of the capacitor is deposited on the upper surface of the insulating dielectric layer 8. In the embodiment of FIG. 4, it is assumed that nitride and oxide are alternately stacked to form a film stack structure, and that nitride is used to form support layers and oxide is used to form sacrificial layers.

As shown in FIG. 4, it is assumed that there are total three support layers, labeled 91, 92, and 93, and total two sacrificial layers, labeled 101 and 102. However, this is only used as an example, and the present disclosure is not limited thereto.

Figure 5:
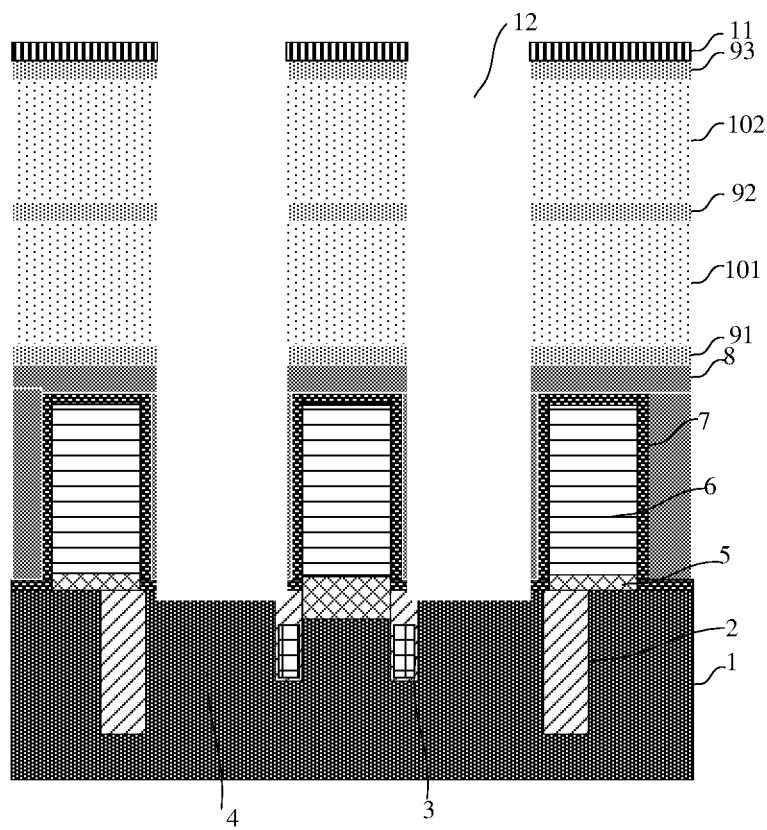

As shown in FIG. 5, a hard mask layer 11 is deposited on the upper surface of the uppermost support layer 93, and the hard mask layer is etched by a photomask to form through holes 12 so that the through holes 12 penetrate through the film stack structure to expose the sources 4 of the transistors in the semiconductor substrate 1.

Figure 6:
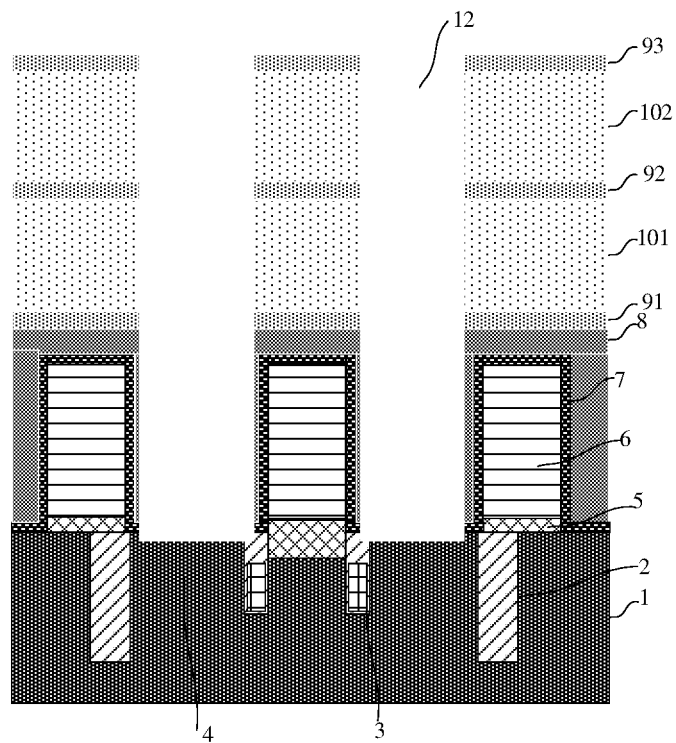

As shown in FIG. 6, the hard mask layer 11 is removed.

Figure 7:
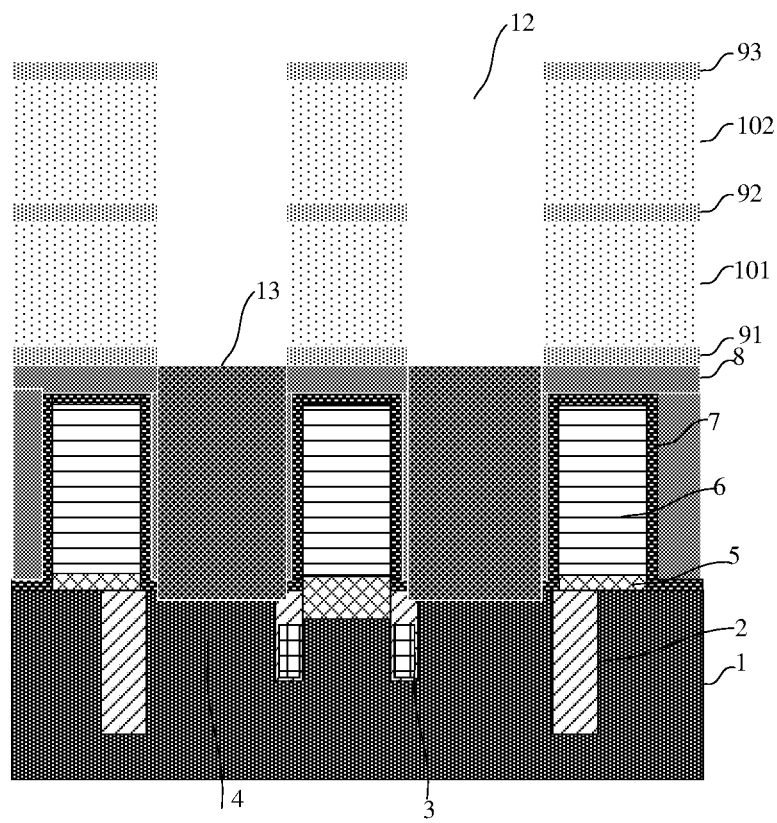

As shown in FIG. 7, a storage node contact layer 13 is formed in the through holes 12 by the SEG process. Monocrystalline silicon may be formed. Doping or ion implantation may be further performed to improve the conductivity of the storage node contact layer 13.

In the embodiment of FIG. 7, the upper surface of the storage node contact layer 13 is horizontally aligned with the lower surface of the film stack structure of the capacitor, that is, the lower surface of the bottommost support layer 91 here.

Figure 8:
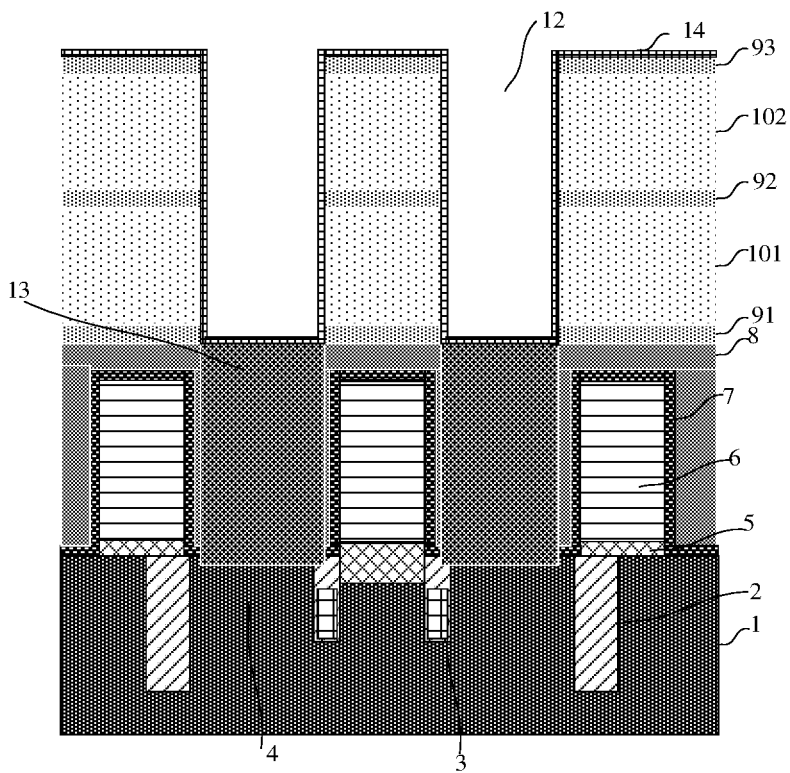

As shown in FIG. 8, a bottom electrode 14 of the capacitor is deposited on the exposed surface of the film stack structure and on the upper surface of the storage node contact layer 13.

Figure 9:
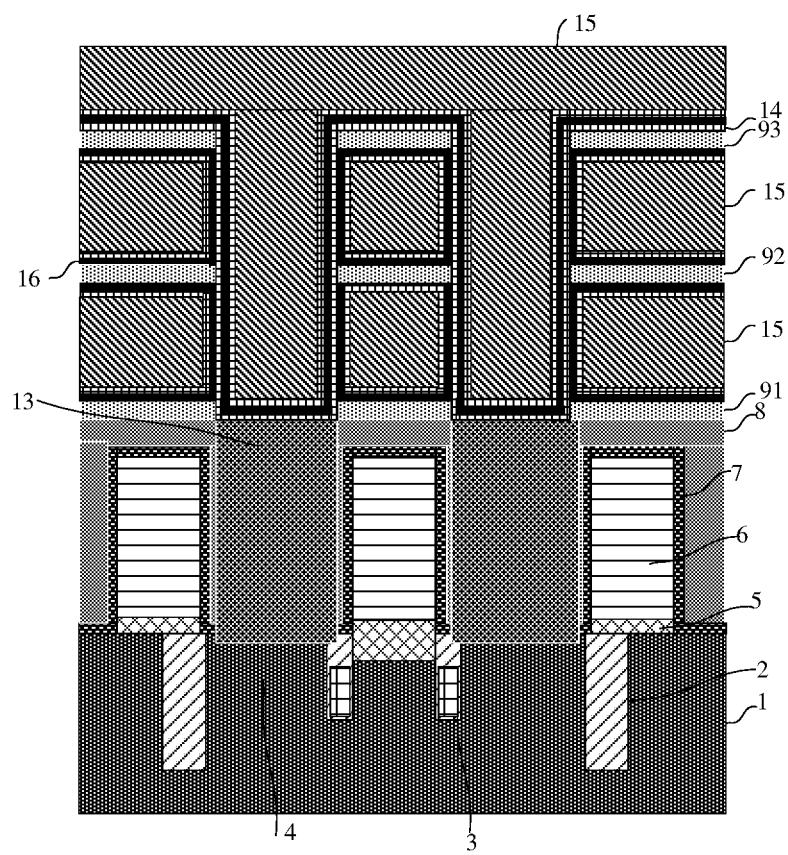

The sacrificial layers in the film stack structure, for example the sacrificial layer 101 and the sacrificial layer 102 here, is removed. As shown in FIG. 9, the dielectric layer 15 and the top electrode 16 of the capacitor are deposited, and the bottom electrode 14, the dielectric layer 15 and the top electrode 16 form a capacitor structure. The dielectric layer 15 may be a high-k dielectric layer. The high-k dielectric layer may comprise multiple layers.

In the embodiment of the present disclosure, the capacitor structure is not limited. For example, as shown in FIG. 9, it may be a cylindrical capacitor. For another example, it may be a multi-faceted capacitor. The preparation process of the capacitor is also not limited in the present disclosure.

As shown in FIG. 9, a high-K dielectric layer and a top electrode plate are deposited, and the top electrode forms a capacitor structure.

In the semiconductor memory preparation method in embodiments of FIGS. 2-9, after the BL structure is prepared, the insulating dielectric layer is directly filled, polished and flattened. The film stack structure of the cell is deposited. The film stack structure of the cell is etched by the photomask to form a capacitor hole penetrating through the film stack and the lower part of the insulating dielectric layer, to connect with the semiconductor substrate, to form through holes. Only one alignment of the cell and the active area by the photomask is required. In this way, a lot of preparation processes can be reduced.

Figure 10:
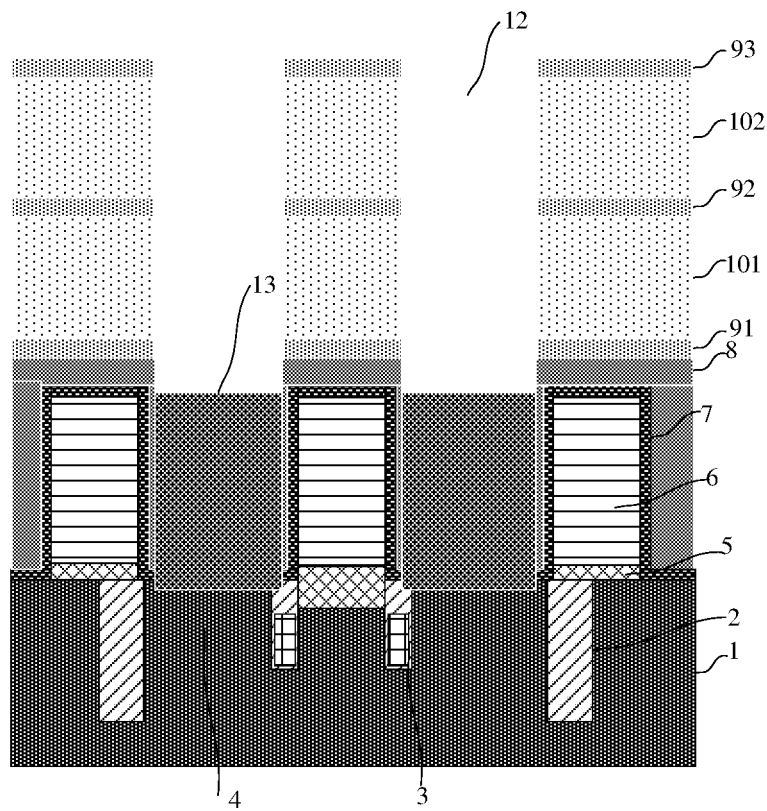
FIGS. 10-12 schematically show a flowchart of a semiconductor memory preparation method according to an embodiment of the present disclosure.
Figure 11:
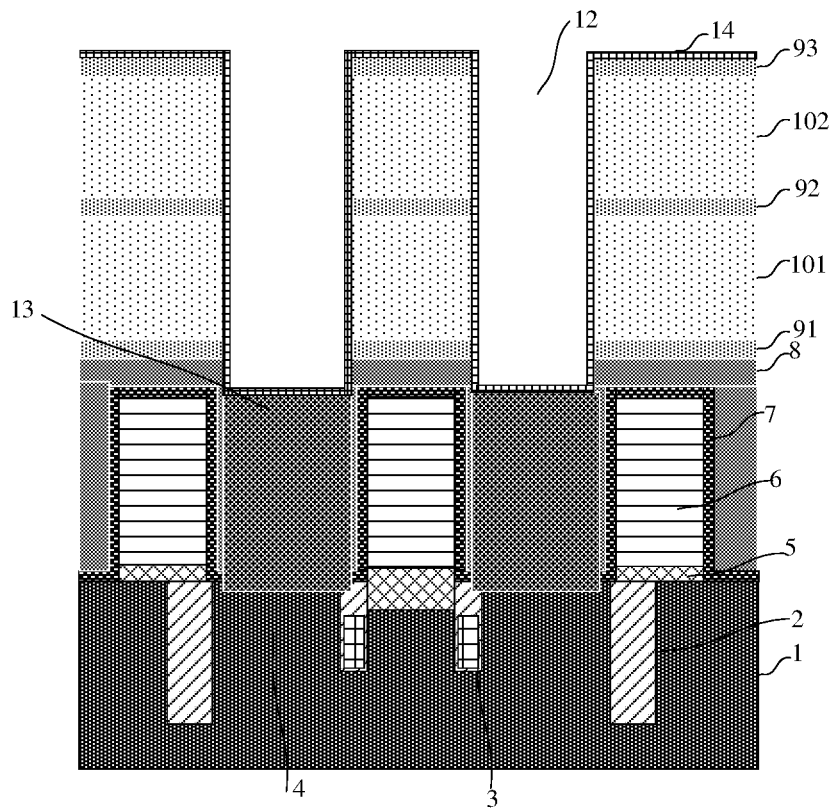
Figure 12:
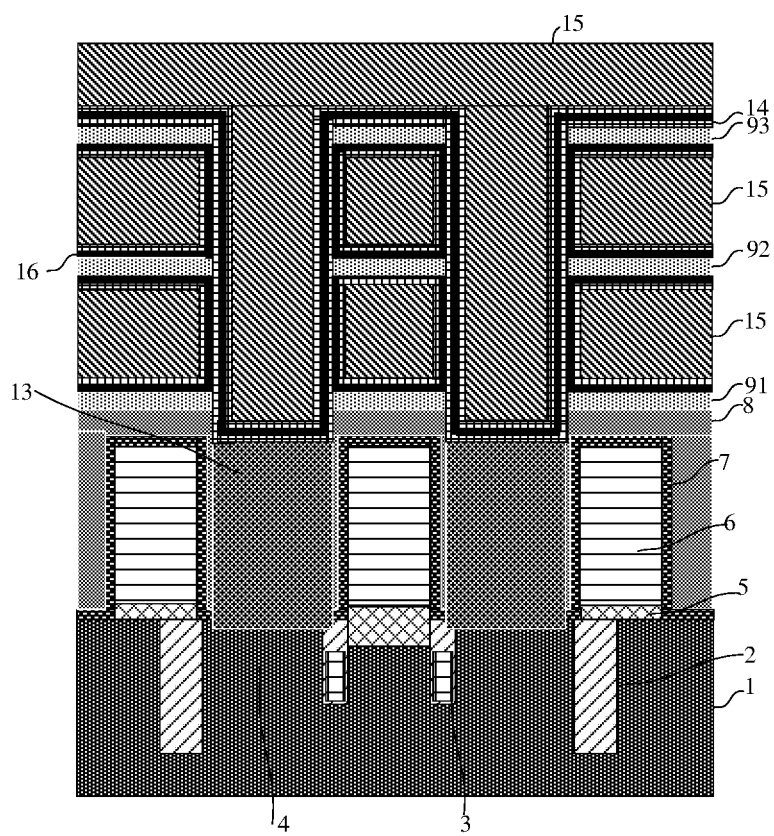

FIGS. 10-12 schematically show a flowchart of a semiconductor memory preparation method according to an embodiment of the present disclosure.

For the process steps before FIG. 10, reference may be made to the description of FIGS. 2-6.

As shown in FIG. 10, the storage node contact layer 13 is formed in the through holes 12 by the SEG process. Doping or ion implantation may be further performed to improve the conductivity of the storage node contact layer 13.

In the embodiment of FIG. 10, the upper surface of the storage node contact layer 13 is slightly higher than the bitline 6 and lower than the bottommost layer of the film stack structure of the capacitor, that is, the upper surface of the storage node contact layer 13 is lower than the bottom surface of the support layer 91 in the bottommost layer of the film stack structure.

As shown in FIG. 11, a bottom electrode 14 of the capacitor is deposited on the exposed surface of the film stack structure and on the upper surface of the storage node contact layer 13.

The sacrificial layers in the film stack structure, for example the sacrificial layer 101 and the sacrificial layer 102 here, is removed. As shown in FIG. 12, the dielectric layer 15 and the top electrode 16 of the capacitor are deposited, and the bottom electrode 14, the dielectric layer 15 and the top electrode 16 form a capacitor structure.

In the embodiment of the present disclosure, the capacitor structure is not limited. For example, as shown in FIG. 12, it may be a cylindrical capacitor. For another example, it may be a multi-faceted capacitor.

In the semiconductor memory preparation method in embodiments of FIGS. 10-12, the height of the upper surface of the epitaxially grown storage node contact layer by the SEG process is slightly higher than the bitlines and lower than the bottommost layer of the film stack structure of the capacitor, so that the bottom electrode is directly connected to the storage node contact layer below the film stack structure of the capacitor. This increases the length of the capacitor and increases the storage capacity of the capacitor.

Figure 13:
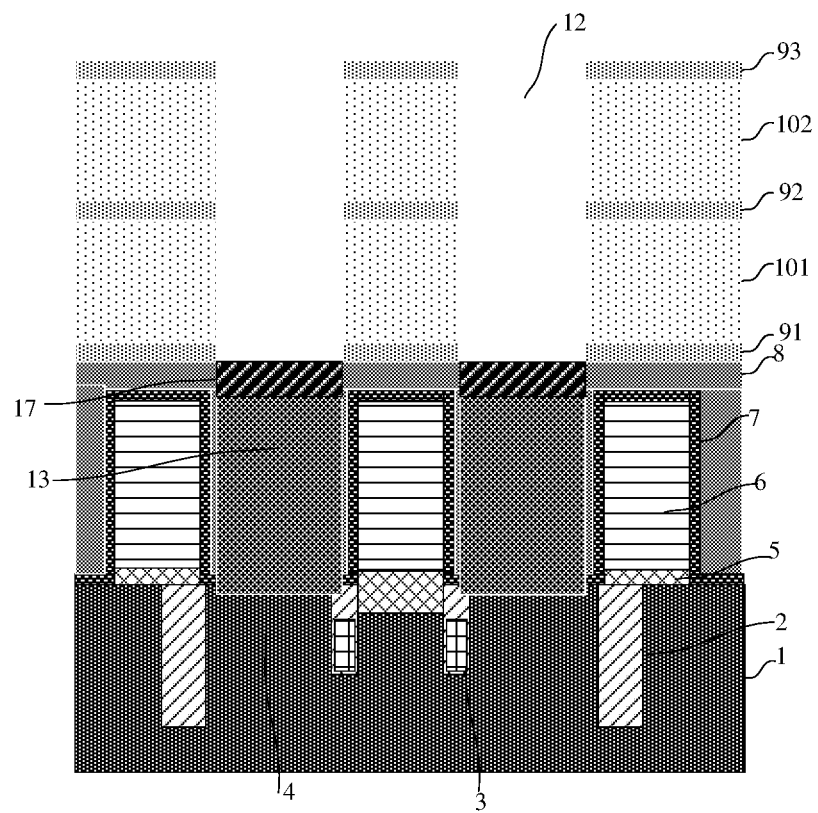
FIGS. 13-15 schematically show a flowchart of a semiconductor memory preparation method according to an embodiment of the present disclosure.
Figure 14:
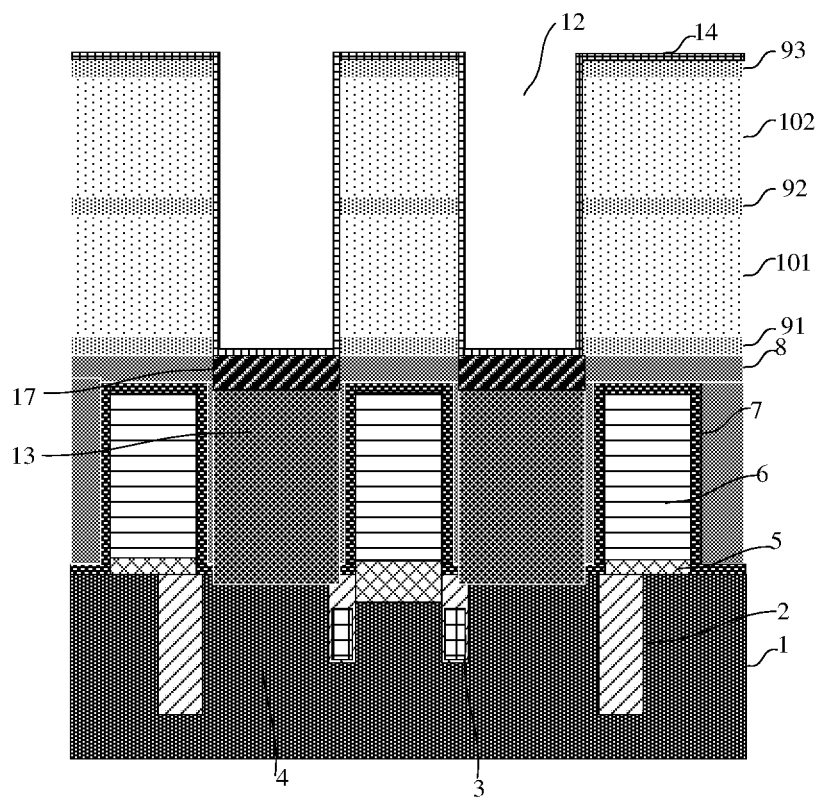
Figure 15:
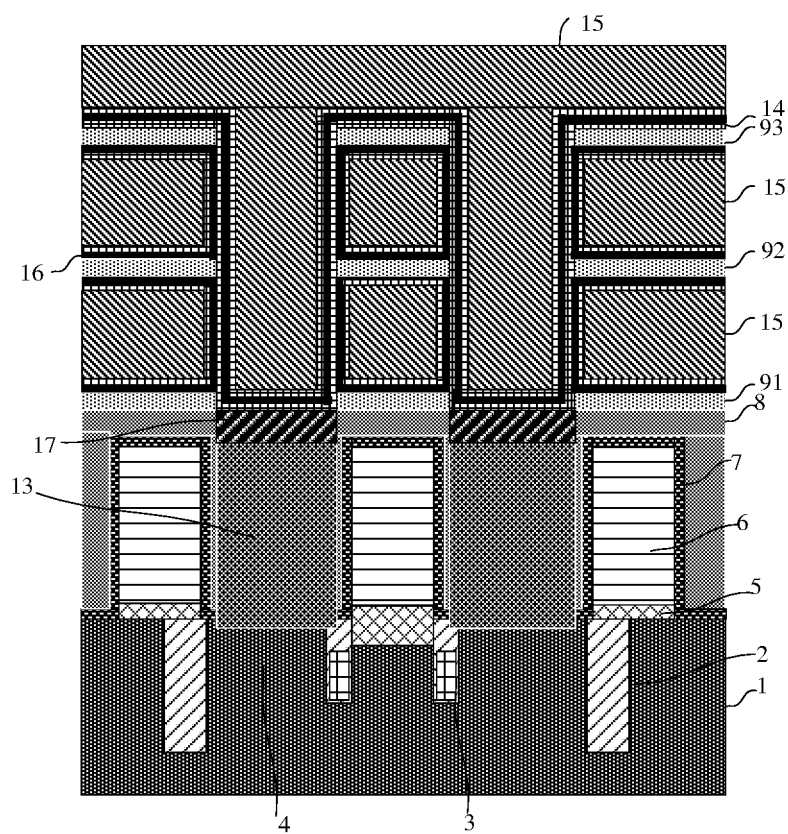

FIGS. 13-15 schematically show a flowchart of a semiconductor memory preparation method according to an embodiment of the present disclosure.

For the process steps before FIG. 13, reference may be made to the descriptions of FIGS. 2-6 and FIG. 10. That is, the upper surface of the formed storage node contact layer 13 is slightly higher than the bitline 6 and lower than the bottommost layer of the film stack structure of the capacitor.

As shown in FIG. 13, a metal layer 17 is deposited on the upper surface of the storage node contact layer 13. The upper surface of the metal layer 17 is flush with the lower surface of the film stack structure. That is, the upper surface of the metal layer 17 is flush with the lower surface of the support layer 91 in the bottommost layer of the film stack structure.

As shown in FIG. 14, a bottom electrode 14 of the capacitor is deposited on the exposed surface of the film stack structure and on the upper surface of the metal layer 17.

The sacrificial layers in the film stack structure, for example the sacrificial layer 101 and the sacrificial layer 102 here, is removed. As shown in FIG. 15, the dielectric layer 15 and the top electrode 16 of the capacitor are deposited, and the bottom electrode 14, the dielectric layer 15 and the top electrode 16 form a capacitor structure.

In the embodiment of the present disclosure, the capacitor structure is not limited. For example, as shown in FIG. 15, it may be a cylindrical capacitor. For another example, it may be a multi-faceted capacitor.

In the semiconductor memory preparation method in embodiments of FIGS. 13-15, on one hand, the height of the upper surface of the epitaxially grown storage node contact layer by the SEG process is slightly higher than the bitline and lower than the bottommost layer of the film stack structure of the capacitor, so that the bottom electrode is directly connected to the storage node contact layer below the film stack structure of the capacitor. This increases the length of the capacitor and increases the storage capacity of the capacitor. On the other hand, by further depositing a metal layer on the upper surface of the storage node contact layer, the conductivity of the storage node contact layer may be improved, and meanwhile, the connection with the bottom electrode may be improved and the stress on the contact interface may be reduced.

Figure 16:
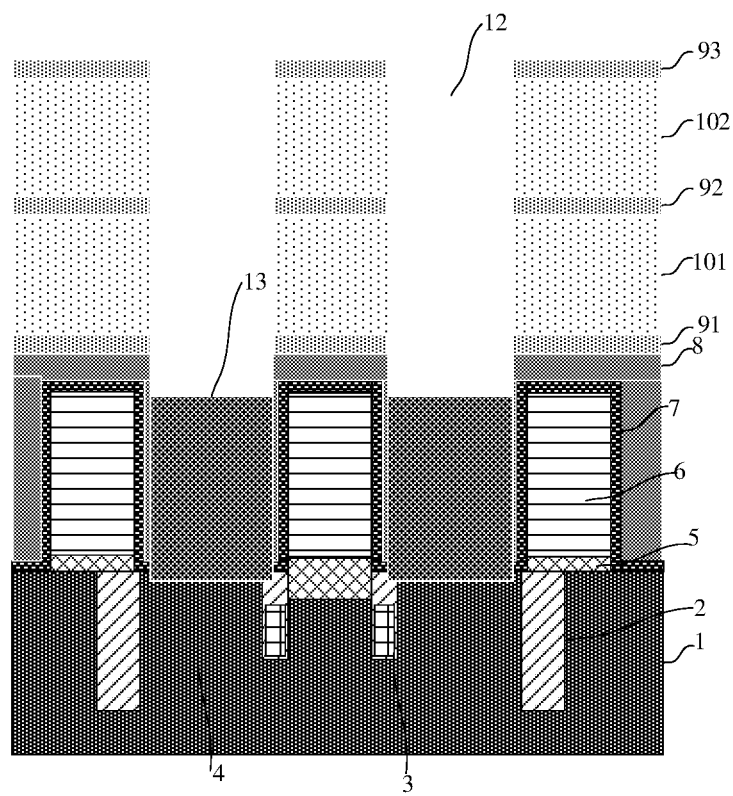
FIGS. 16-18 schematically show a flowchart of a semiconductor memory preparation method according to an embodiment of the present disclosure.
Figure 17:
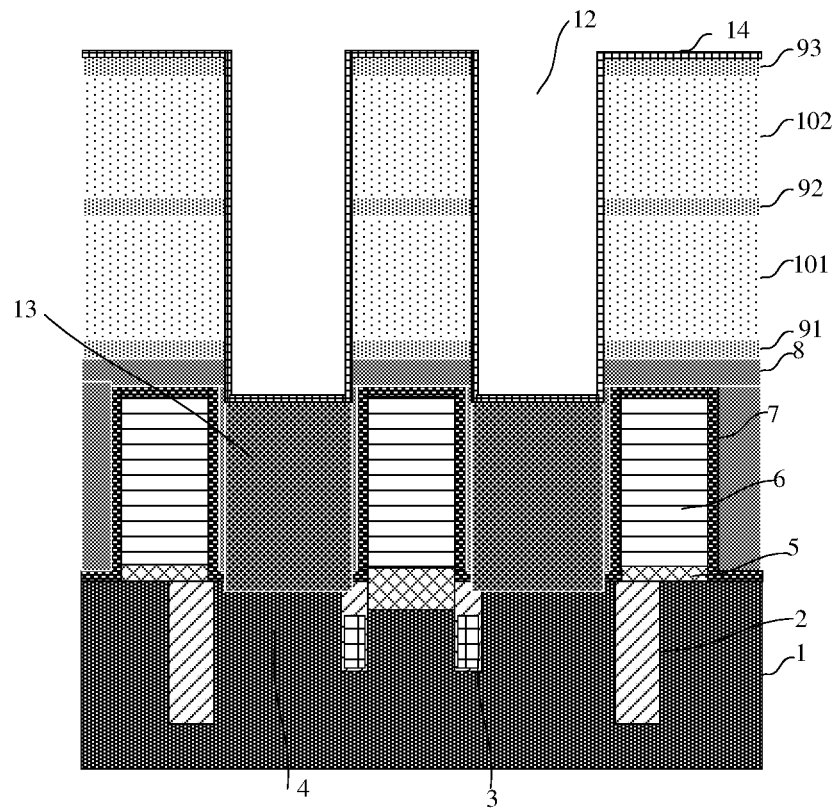
Figure 18:
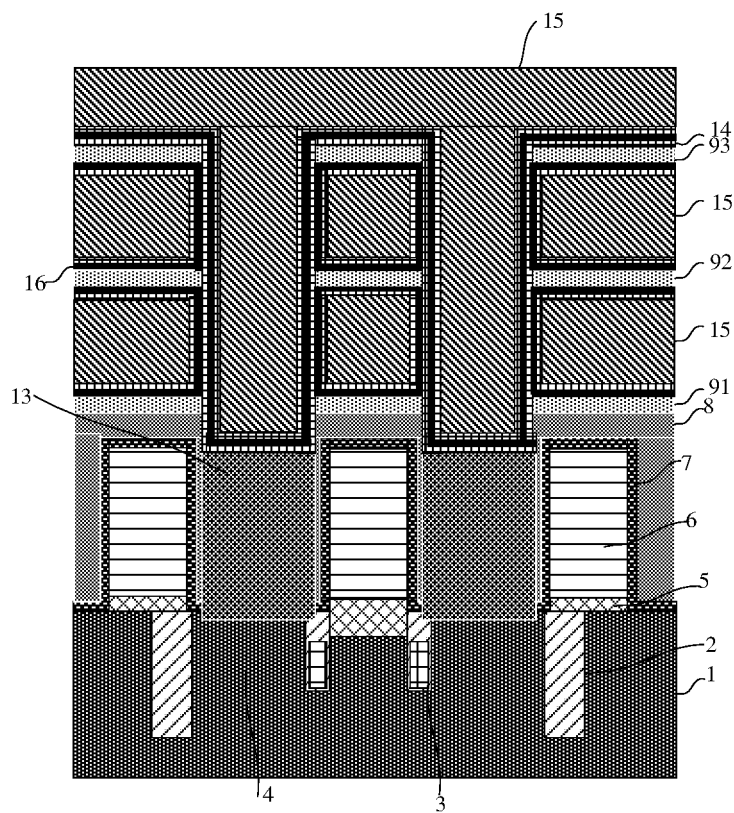

FIGS. 16-18 schematically show a flowchart of a semiconductor memory preparation method according to an embodiment of the present disclosure. For the process steps before FIG. 16, reference may be made to the description of FIGS. 2-6.

As shown in FIG. 16, the storage node contact layer 13 is formed in the through holes 22 by the SEG process. In the embodiment of FIG. 16, the upper surface of the storage node contact layer 13 is slightly lower than the upper surface of the bitline 6.

As shown in FIG. 17, a bottom electrode 14 of the capacitor is deposited on the upper surface of the storage node contact layer 13.

The sacrificial layers in the film stack structure, for example the sacrificial layer 101 and the sacrificial layer 102 here, is removed. As shown in FIG. 18, the dielectric layer 15 and the top electrode 16 of the capacitor are deposited, and the bottom electrode 14, the dielectric layer 15 and the top electrode 16 form a capacitor structure.

In the embodiment of the present disclosure, the capacitor structure is not limited. For example, as shown in FIG. 18, it may be a cylindrical capacitor. For another example, it may be a multi-faceted capacitor.

In the semiconductor memory preparation method in embodiments of FIGS. 16-18, the upper surface of the epitaxially grown storage node contact layer by the SEG process is slightly lower than the bitline, so that the bottom electrode is directly connected to the storage node contact layer below the film stack structure of the capacitor. This increases the length of the capacitor and increases the storage capacity of the capacitor.

Figure 19:
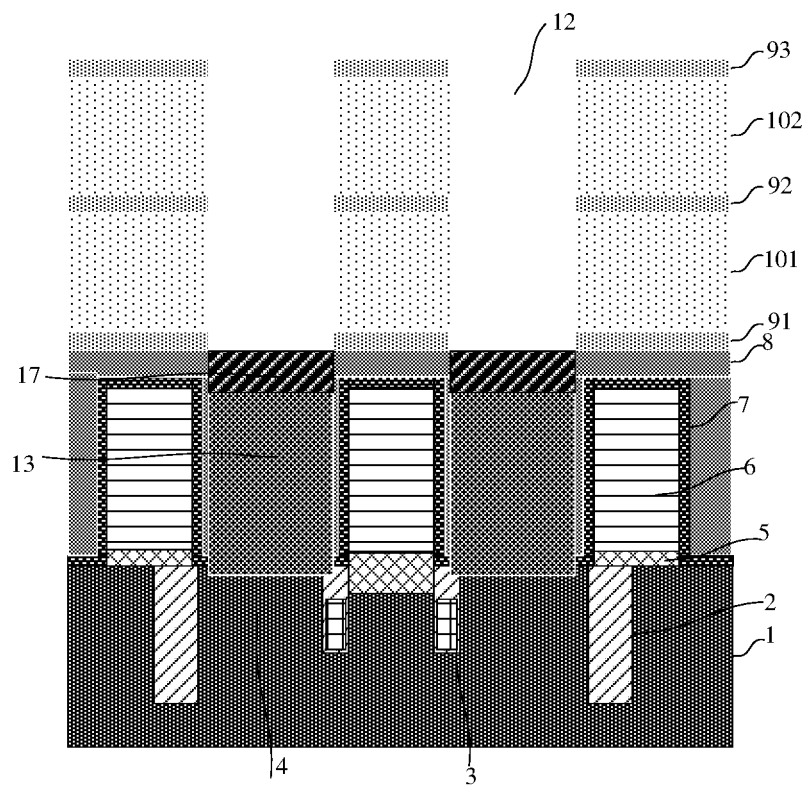
FIGS. 19-21 schematically show a flowchart of a semiconductor memory preparation method according to an embodiment of the present disclosure.
Figure 20:
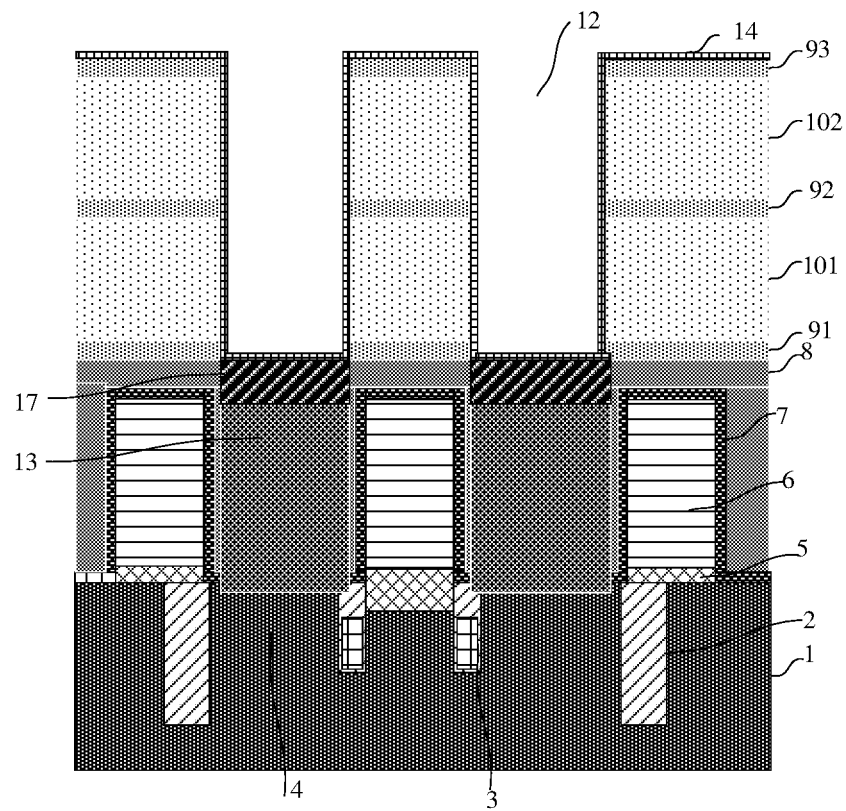
Figure 21:
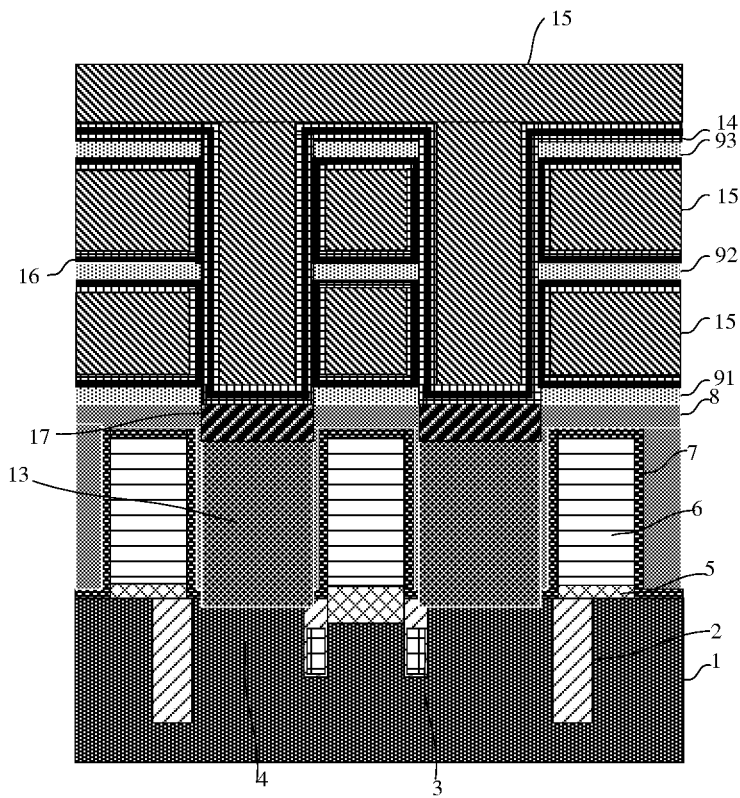

FIGS. 19-21 schematically show a flowchart of a semiconductor memory preparation method according to an embodiment of the present disclosure. For the process steps before FIG. 19, reference may be made to FIGS. 2-6 and FIG. 16. That is, the upper surface of the storage node contact layer 13 is slightly lower than the upper surface of the bitline 6.

As shown in FIG. 19, a metal layer 17 is deposited on the upper surface of the storage node contact layer 13. The upper surface of the metal layer 17 is flush with the lower surface of the film stack structure. That is, the upper surface of the metal layer 17 is flush with the lower surface of the support layer 91 in the bottommost layer of the film stack structure.

As shown in FIG. 20, a bottom electrode 14 of the capacitor is deposited on the exposed surface of the film stack structure and on the upper surface of the metal layer 17.

The sacrificial layers in the film stack structure, for example the sacrificial layer 101 and the sacrificial layer 102 here, is removed. As shown in FIG. 21, the dielectric layer 15 and the top electrode 16 of the capacitor are deposited, and the bottom electrode 14, the dielectric layer 15 and the top electrode 16 form a capacitor structure.

In the embodiment of the present disclosure, the capacitor structure is not limited. For example, as shown in FIG. 21, it may be a cylindrical capacitor. For another example, it may be a multi-faceted capacitor.

In the semiconductor memory preparation method in embodiments of FIGS. 19-21, on one hand, the upper surface of the epitaxially grown storage node contact layer by the SEG process is slightly lower than the bitline, so that the bottom electrode is directly connected to the storage node contact layer below the film stack structure of the capacitor. This increases the length of the capacitor and increases the storage capacity of the capacitor. On the other hand, by further depositing a metal layer on the upper surface of the storage node contact layer, the conductivity of the storage node contact layer may be improved, and meanwhile, the connection with the bottom electrode may be improved and the stress on the contact interface may be reduced.

Figure 22:
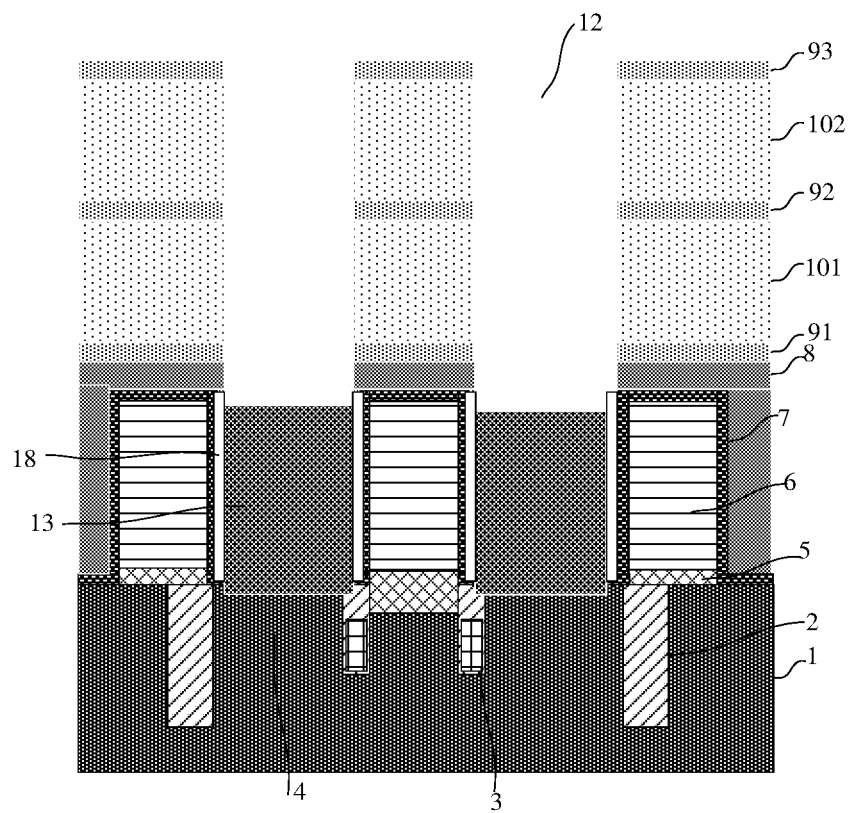
FIGS. 22-24 schematically show a flowchart of a semiconductor memory preparation method according to an embodiment of the present disclosure.
Figure 23:
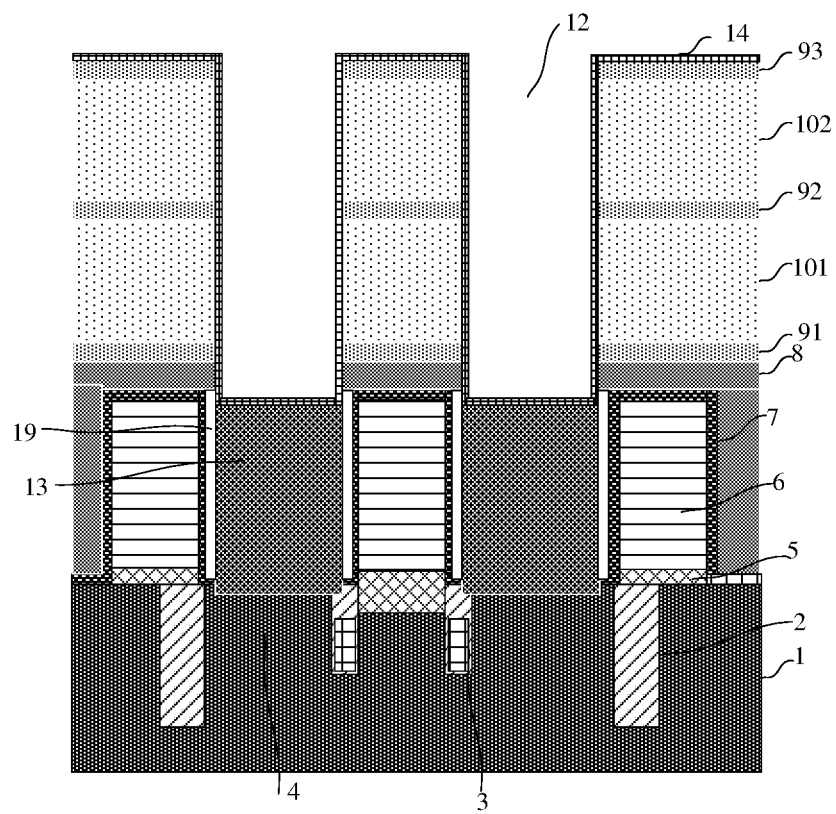
Figure 24:
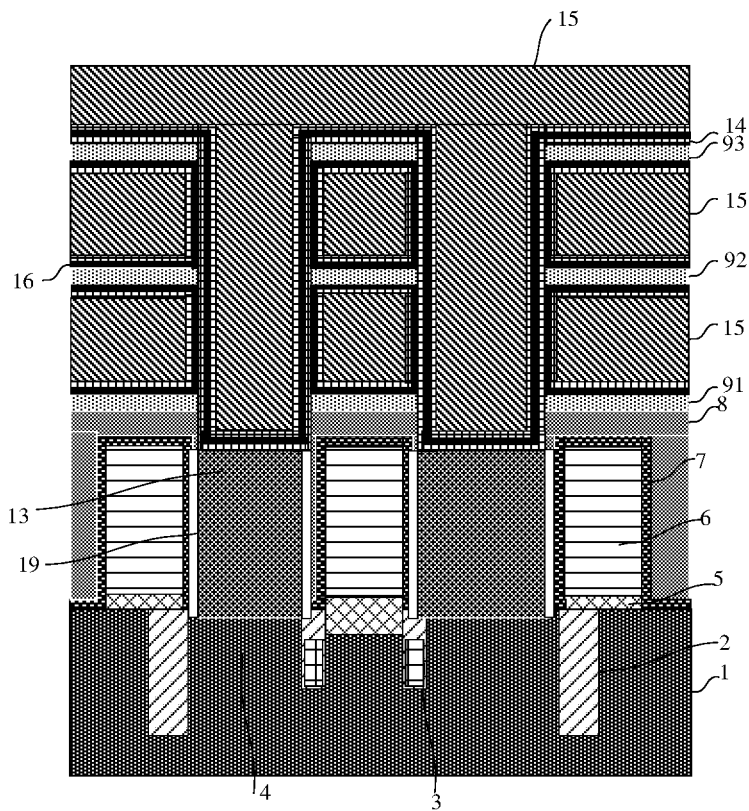

FIGS. 22-24 schematically show a flowchart of a semiconductor memory preparation method according to an embodiment of the present disclosure. For the process steps before FIG. 22, reference may be made to FIGS. 2-6 and FIG. 16. That is, the upper surface of the storage node contact layer 13 is slightly lower than the upper surface of the bitline 6.

As shown in FIG. 22, the upper surface of the storage node contact layer 13 is etched using an etching solution. Due to the etch selectivity ratio, at least part of the bitline isolating layer 7 between the bitline 6 and the storage node contact layer 13 is etched away. Air clearances 18 are formed between the storage node contact layer 13 and the bitline 6.

As shown in FIG. 23, the bottom electrode 14 of the capacitor is quickly deposited on the exposed surface of the film stack structure and the upper surface of the storage node contact layer 13. The bottom electrode 14 is connected to the storage node contact layer 13 on the upper surface of the storage node contact layer 13. The bottom electrode 14 closes the air clearances 18 around the storage node contact layer 13 to form enclosed air gaps 19.

As shown in FIG. 24, after removing the sacrificial layers in the film stack structure, the dielectric layer 15 and the top electrode 16 of the capacitor are deposited, and the bottom electrode 14, the dielectric layer 15 and the top electrode 16 form a capacitor structure.

In the embodiment of the present disclosure, the capacitor structure is not limited. For example, as shown in FIG. 24, it may be a cylindrical capacitor. For another example, it may be a multi-faceted capacitor.

In the semiconductor memory preparation method in embodiments of FIGS. 22-24, on one hand, the height of the upper surface of the epitaxially grown storage node contact layer by the SEG process is slightly lower than the bitline, so that the bottom electrode is directly connected to the storage node contact layer below the film stack structure of the capacitor. This increases the length of the capacitor and increases the storage capacity of the capacitor. On the other hand, by wet etching the bitline isolating layer, air gaps are formed between the storage node contact layer and the bitline. This can improve the isolation effect and reduce the parasitic capacitance.

Figure 25:
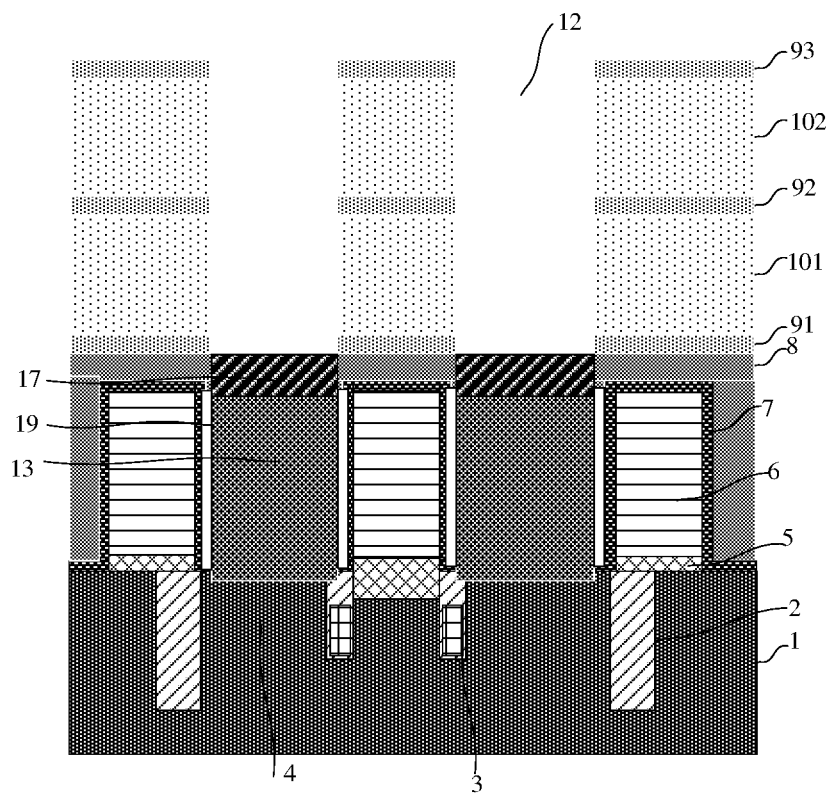
FIGS. 25-27 schematically show a flowchart of a semiconductor memory preparation method according to an embodiment of the present disclosure.
Figure 26:
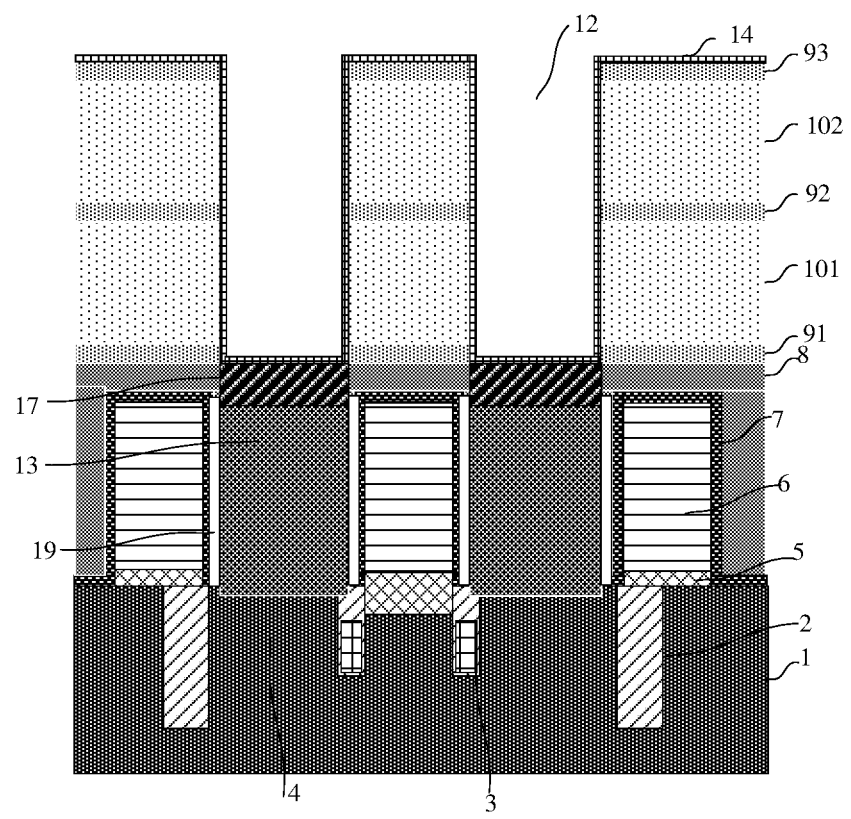
Figure 27:
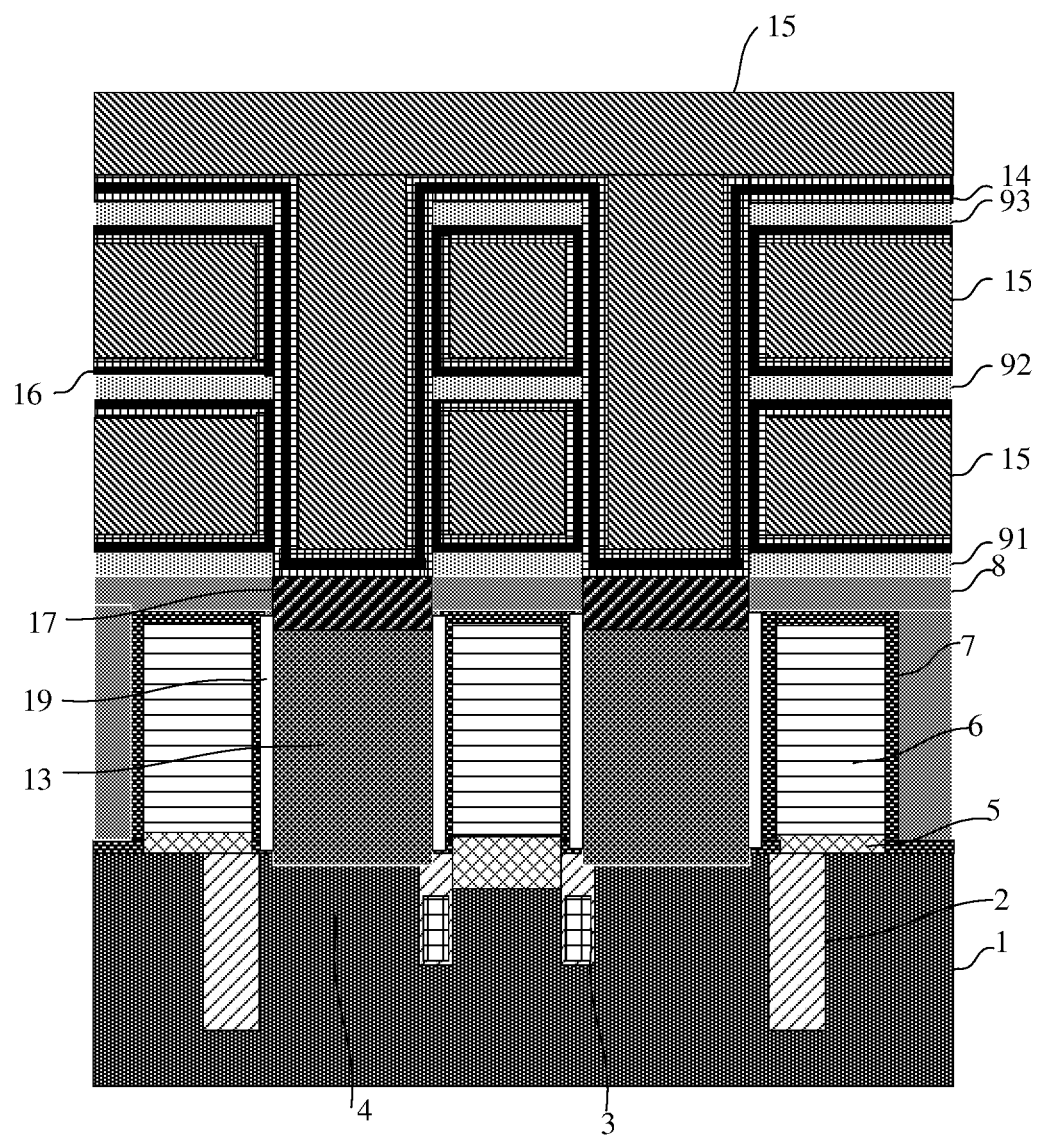

FIGS. 25-27 schematically show a flowchart of a semiconductor memory preparation method according to an embodiment of the present disclosure. For the process steps before FIG. 25, reference may be made to the description of FIGS. 2-6, FIG. 16 and FIGS. 22-23. That is, the upper surface of the storage node contact layer 13 is slightly lower than the upper surface of the bitline 6, and the bottom electrode 14 closes the air clearances 18 around the storage node contact layer 13 to form enclosed air gaps 19.

As shown in FIG. 25, a metal layer 17 is deposited on the upper surface of the storage node contact layer 13. The upper surface of the metal layer 17 is flush with the lower surface of the film stack structure. The metal layer 17 closes the air clearances 18 around the storage node contact layer 13 to form enclosed air gaps 19.

As shown in FIG. 26, a bottom electrode 14 of the capacitor is deposited on the exposed surface of the film stack structure and on the upper surface of the metal layer 17.

As shown in FIG. 27, after removing the sacrificial layers in the film stack structure, the dielectric layer 15 and the top electrode 16 of the capacitor are deposited, and the bottom electrode 14, the dielectric layer 15 and the top electrode 16 form a capacitor structure.

In the embodiment of the present disclosure, the capacitor structure is not limited. For example, as shown in FIG. 27, it may be a cylindrical capacitor. For another example, it may be a multi-faceted capacitor.

In the semiconductor memory preparation method in embodiments of FIGS. 25-27, on one hand, the height of the upper surface of the epitaxially grown storage node contact layer by the SEG process is slightly lower than the bitline, so that the bottom electrode is directly connected to the storage node contact layer below the film stack structure of the capacitor. This increases the length of the capacitor and increases the storage capacity of the capacitor. On the other hand, by further depositing a metal layer on the upper surface of the storage node contact layer, the conductivity of the storage node contact layer may be improved, and meanwhile, the connection with the bottom electrode may be improved and the stress on the contact interface may be reduced. Meanwhile, by wet etching the bitline isolating layer, air gaps are formed between the storage node contact layer and the bitline. This can improve the isolation effect and reduce the parasitic capacitance.

Further, an embodiment of the present disclosure further provides a semiconductor memory, comprising: a semiconductor substrate, in which transistors are formed and have an array layout; a film stack structure, located on the semiconductor substrate; a storage node contact layer, located in the film stack structure and in contact with the sources of the transistors; and a bottom electrode of the capacitor, located on the surface of the storage node contact layer.

In an exemplary embodiment, the film stack structure may comprise a support layer, and the semiconductor memory may further comprise: dielectric layer, located between the support layers and on the bottom electrode; and a top electrode of the capacitor, located on the dielectric layer.

In an exemplary embodiment, the upper surface of the storage node contact layer may be horizontally aligned with the lower surface of the film stack structure. For example, reference may be made to FIG. 9.

In an exemplary embodiment, a bitline contact layer, a bitline, a bitline isolating layer, and an insulating dielectric layer may be further provided between the semiconductor substrate and the film stack structure.

In an exemplary embodiment, the upper surface of the storage node contact layer may be higher than the bitline and lower than the lower surface of the film stack structure. For example, reference may be made to FIG. 12.

In an exemplary embodiment, the upper surface of the storage node contact layer may be lower than the bitline. For example, reference may be made to FIG. 18.

In an exemplary embodiment, when the upper surface of the storage node contact layer may be higher than the bitline and lower than the lower surface of the film stack structure, a metal layer may be provided between the storage node contact layer and the bottom electrode. For example, reference may be made to FIG. 15.

In an exemplary embodiment, when the upper surface of the storage node contact layer is lower than the bitline, a metal layer may be further provided between the storage node contact layer and the bottom electrode. For example, reference may be made to FIG. 21.

In an exemplary embodiment, when the upper surface of the storage node contact layer is lower than the bitline, air gaps closed by the bottom electrode may be formed between the storage node contact layer and the bitline. For example, reference may be made to FIG. 24.

In an exemplary embodiment, when the upper surface of the storage node contact layer is lower than the bitline, a metal layer may be further provided between the storage node contact layer and the bottom electrode; and air gaps closed by the metal layer is formed between the storage node contact layer and the bitline. For example, reference may be made to FIG. 27.

Those skilled in the art will readily think of other embodiments of the present disclosure by considering the specification and practicing the invention disclosed herein. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

The invention claimed is:

1. A semiconductor memory preparation method, comprising:
    providing a semiconductor substrate in which transistors are formed and have an array layout;
    forming a film stack structure on the semiconductor substrate, wherein the film stack structure comprises sacrificial layers and support layers;
    forming through holes penetrating the film stack structure to expose sources of the transistors;
    epitaxially growing a storage node contact layer on exposed surfaces of the sources of the transistors;
    forming a bottom electrode of a capacitor on a surface of the storage node contact layer; and
    after the forming a bottom electrode of a capacitor on a surface of the storage node contact layer:
        removing the sacrificial layers;

depositing a dielectric layer located between the support layers and on the bottom electrode; and
forming a top electrode of the capacitor on the dielectric layer.

2. The semiconductor memory preparation method according to claim 1, wherein an upper surface of the storage node contact layer is horizontally aligned with a lower surface of the film stack structure.

3. The semiconductor memory preparation method according to claim 1, wherein, before the forming a film stack structure on the semiconductor substrate, the method further comprises:
forming a bitline contact layer on the semiconductor substrate;
forming a bitline on the bitline contact layer;
forming a bitline isolating layer on a surface of the bitline; and
forming an insulating dielectric layer on the bitline isolating layer.

4. The semiconductor memory preparation method according to claim 3, wherein an upper surface of the storage node contact layer is higher than the bitline and lower than a lower surface of the film stack structure; or the upper surface of the storage node contact layer is lower than the bitline.

5. The semiconductor memory preparation method according to claim 4, wherein the forming a bottom electrode of a capacitor on a surface of the storage node contact layer comprises:
depositing a metal layer on the upper surface of the storage node contact layer; and
forming the bottom electrode of the capacitor on a surface of the metal layer.

6. The semiconductor memory preparation method according to claim 4, wherein, when the upper surface of the storage node contact layer is lower than the bitline, the forming a bottom electrode of a capacitor on a surface of the storage node contact layer comprises:
etching the bitline isolating layer to form air clearances between the storage node contact layer and the bitline; and
forming the bottom electrode of the capacitor on the surface of the storage node contact layer, with the bottom electrode closing the air clearances to form air gaps.

7. The semiconductor memory preparation method according to claim 4, wherein, when the upper surface of the storage node contact layer is lower than the bitline, the forming a bottom electrode of a capacitor on a surface of the storage node contact layer comprises:
etching the bitline isolating layer to form air clearances between the storage node contact layer and the bitline;
depositing a metal layer on the upper surface of the storage node contact layer, with the metal layer closing the air clearances to form air gaps; and
forming the bottom electrode of the capacitor on a surface of the metal layer.

8. The semiconductor memory preparation method according to claim 1, wherein the forming through holes penetrating the film stack structure to expose sources of the transistors comprises:
depositing a hard mask layer on a surface of the film stack structure;
etching, by a photomask, the hard mask layer to form the through holes, to expose the sources of the transistors; and
removing the hard mask layer.

9. The semiconductor memory preparation method according to claim 1, wherein the epitaxially growing a storage node contact layer on exposed surfaces of the sources of the transistors comprises:
forming a silicon epitaxial storage node contact layer by selective epitaxial growth of silicon on the exposed surfaces of the sources of the transistors; and
doping the silicon epitaxial storage node contact layer in situ to form the storage node contact layer.

10. The semiconductor memory preparation method according to claim 1, wherein the epitaxially growing a storage node contact layer on exposed surfaces of the sources of the transistors comprises:
forming a silicon epitaxial storage node contact layer by selective epitaxial growth of silicon on the exposed surfaces of the sources of the transistors; and
performing an ion implantation on the silicon epitaxial storage node contact layer to form the storage node contact layer.

11. A semiconductor memory, comprising:
a semiconductor substrate, in which transistors are formed and have an array layout;
a film stack structure, located on the semiconductor substrate;
a bitline contact layer, a bitline, a bitline isolating layer, and an insulating dielectric layer, located between the semiconductor substrate and the film stack structure;
a storage node contact layer, located between the semiconductor substrate and the film stack structure, and in contact with sources of the transistors; and
a bottom electrode of a capacitor, located on a surface of the storage node contact layer;
wherein an upper surface of the storage node contact layer is higher than the bitline and lower than a lower surface of the film stack structure; or the upper surface of the storage node contact layer is lower than the bitline;
wherein when the upper surface of the storage node contact layer is lower than the bitline, air gaps closed by the bottom electrode are formed between the storage node contact layer and the bitline.

12. The semiconductor memory according to claim 11, wherein the film stack structure comprises support layers, and the semiconductor memory further comprises:
a dielectric layer, located between the support layers and on the bottom electrode; and
a top electrode of the capacitor, located on the dielectric layer.

13. The semiconductor memory according to claim 11, wherein a metal layer is further provided between the storage node contact layer and the bottom electrode.

14. The semiconductor memory according to claim 11, wherein, when the upper surface of the storage node contact layer is lower than the bitline, a metal layer is further provided between the storage node contact layer and the bottom electrode; and air gaps closed by the metal layer are formed between the storage node contact layer and the bitline.

15. A semiconductor memory, comprising:
a semiconductor substrate, in which transistors are formed and have an array layout;
a film stack structure, located on the semiconductor substrate;
a bitline contact layer, a bitline, a bitline isolating layer, and an insulating dielectric layer, located between the semiconductor substrate and the film stack structure;

a storage node contact layer, located between the semiconductor substrate and the film stack structure, and in contact with sources of the transistors; and a bottom electrode of a capacitor, located on a surface of the storage node contact layer;

wherein an upper surface of the storage node contact layer is higher than the bitline and lower than a lower surface of the film stack structure; or the upper surface of the storage node contact layer is lower than the bitline;

wherein when the upper surface of the storage node contact layer is lower than the bitline, a metal layer is further provided between the storage node contact layer and the bottom electrode; and air gaps closed by the metal layer are formed between the storage node contact layer and the bitline.

* * * * *